United States Patent [19]

McIntyre

[11] Patent Number: 5,629,611

[45] Date of Patent: May 13, 1997

[54] CURRENT GENERATOR CIRCUIT FOR GENERATING SUBSTANTIALLY CONSTANT CURRENT

[75] Inventor: David H. McIntyre, Bristol, United Kingdom

[73] Assignee: SGS-Thomson Microelectronics Limited, Almondsbury Bristol, United Kingdom

[21] Appl. No.: 519,341

[22] Filed: Aug. 24, 1995

[30] Foreign Application Priority Data

Aug. 26, 1994 [GB] United Kingdom ............ 9417267

[51] Int. Cl.⁶ ...................................... G05F 3/16
[52] U.S. Cl. ............................. 323/313; 323/316
[58] Field of Search ............................. 323/312, 313, 323/314, 315, 316, 901, 907; 327/538, 543

[56] References Cited

U.S. PATENT DOCUMENTS

| | | | |
|---|---|---|---|
| Re. 30,586 | 4/1981 | Brokaw | 323/314 |
| 4,443,753 | 4/1984 | McGlinchey | 323/313 |
| 4,978,868 | 12/1990 | Giordano et al. | 307/296.6 |
| 5,039,878 | 8/1991 | Armstrong et al. | 307/310 |
| 5,063,342 | 11/1991 | Hughes et al. | 323/315 |
| 5,103,159 | 4/1992 | Breugnot et al. | 323/315 |
| 5,229,708 | 7/1993 | Donig et al. | 323/223 |
| 5,339,020 | 8/1994 | Siligoni et al. | 323/313 |
| 5,352,972 | 10/1994 | Pernici et al. | 323/313 |
| 5,424,628 | 6/1995 | Nguyen | 323/314 |
| 5,508,958 | 4/1996 | Fazio et al. | 365/185.19 |

FOREIGN PATENT DOCUMENTS

| | | | |
|---|---|---|---|
| 0194031 | 9/1986 | European Pat. Off. | G05F 3/30 |
| 0252320 | 1/1988 | European Pat. Off. | G05F 3/30 |
| 0472202 | 2/1992 | European Pat. Off. | G05F 3/26 |
| 2040087 | 8/1980 | United Kingdom | G05F 3/16 |
| WO-A-8300756 | 3/1983 | WIPO | G05F 3/16 |

*Primary Examiner*—Peter S. Wong
*Assistant Examiner*—Adolf Berhane
*Attorney, Agent, or Firm*—Wolf, Greenfield & Sacks, P.C.; James H. Morris

[57] ABSTRACT

A current generator provides a substantially constant current. The current generator is based on a bandgap circuit and additionally include a current setting device which is located to receive the output signal of the operational amplifier of the bandgap circuit and which is arranged to provide a substantially constant reference current. The circuit is used to particular advantage in a flash memory device.

15 Claims, 2 Drawing Sheets

CURRENT GENERATOR CIRCUIT FOR GENERATING SUBSTANTIALLY CONSTANT CURRENT

FIELD OF THE INVENTION

This invention relates to a current generator circuit, particularly for generating a substantially constant current.

BACKGROUND TO THE INVENTION

The invention is particularly concerned with providing a substantially constant current which can be used as a bias for a power supply detection circuit. Such power supply detection circuits are used in various applications for determining whether or not a power supply voltage has reached an adequate level for operation of the circuit. One particular application of a power supply detection circuit is for a flash memory chip. As the current consumption of a power supply detection circuit is a concern, since a chip's standby current is an important design parameter, it is a particular benefit to have a nearly constant current consumption for this application.

For flash memory chips which are capable of operating at 3.3 V or at 5 V, a power supply detection circuit must thus be capable of detecting a wide range of power supply voltages. Typically, the target operation range is between 2 V and 5.5 V. Moreover, these chips operate within a wide temperature range, for example of between minus 55° C. to 125° C. This means that it is very difficult to obtain a substantially constant bias current with conventional circuits.

A wide variation in the bias current can give problems because circuit parameters such as operation speed can then vary widely so that it is difficult to obtain adequate performance under all conditions.

One known current generator circuit is shown in FIG. 1, which illustrates a simple current mirror. As is well known, this circuit comprises a current setting element in the form of a diode connected p-channel transistor 2 which is connected between a power supply rail Vcc and a first current mirror transistor 4. The current mirror transistor is connected to a second power supply rail Vss and has its gate connected to the gate of a second current mirror transistor 6. This current mirror transistor 6 provides the reference current Iref which is matched to (or a fixed multiple of) the current I set by the current setting transistor 2.

The drawback with this circuit is that the current set by the current setting transistor 2 will vary widely with variations in the supply voltage Vcc and temperature. Thus, the reference current Iref provided by the circuit will also vary with these parameters.

SUMMARY OF THE INVENTION

According to the present invention there is provided a current generator circuit for generating a substantially constant reference current which includes a bandgap reference circuit comprising:

an operational amplifier having first and second inputs receiving signals respectively from intermediate nodes of first and second resistive chains, each resistive chain having in series a first terminal connected to a first potential, a unidirectional current control element, at least one resistive element and a second terminal, the second terminals of the resistive chains being connected at a junction node;

the operational amplifier having an output for supplying an output signal to a control terminal of an output device which has a controllable path connected between a power supply voltage and said junction node of said first and second resistive chains, the current generator circuit further comprising:

a current setting device which receives at a control terminal thereof the output signal of the operational amplifier and which has its controllable path connected between said power supply voltage and a current supply terminal to provide at said current supply terminal a substantially constant reference current.

In the preferred embodiment, the unidirectional current control elements are diode connected bipolar transistors.

To make a current sink, the current supply terminal can be connected to a first current mirror transistor which is connected to a second current mirror transistor which takes a current varying with said substantially constant reference current.

As is well known in a current mirror, the currents may be matched, or a fixed multiple of each other.

In this invention, since the current setting device is controlled by the same signal which controls the output device for the bandgap reference circuit. The bandgap reference circuit is designed to generate a constant reference level at the output device. Thus, this arrangement results in a well controlled and stable current which can be provided to other parts of a circuit through the current mirror transistors.

The operational amplifier can comprise, in a known manner, start-up circuitry, amplification circuitry and output circuitry. Reference currents are required for this circuitry. In the preferred embodiment, these reference currents are derived from the output signal from the operational amplifier which is used to control the output device of the bandgap reference circuit. This results in a particularly well controlled current consumption as well as improved immunity against variations in the power supply voltage.

For a better understanding of the present invention and to show how the same may be carried into effect reference will now be made by way of example to the accompanying drawings.

DESCRIPTION OF THE PREFERRED EMBODIMENT

Figure 1:
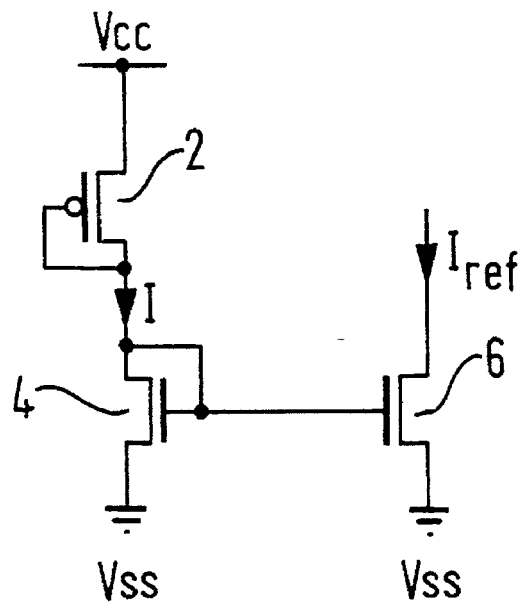
FIG. 1 is a schematic diagram of a known current mirror circuit.
Figure 2:
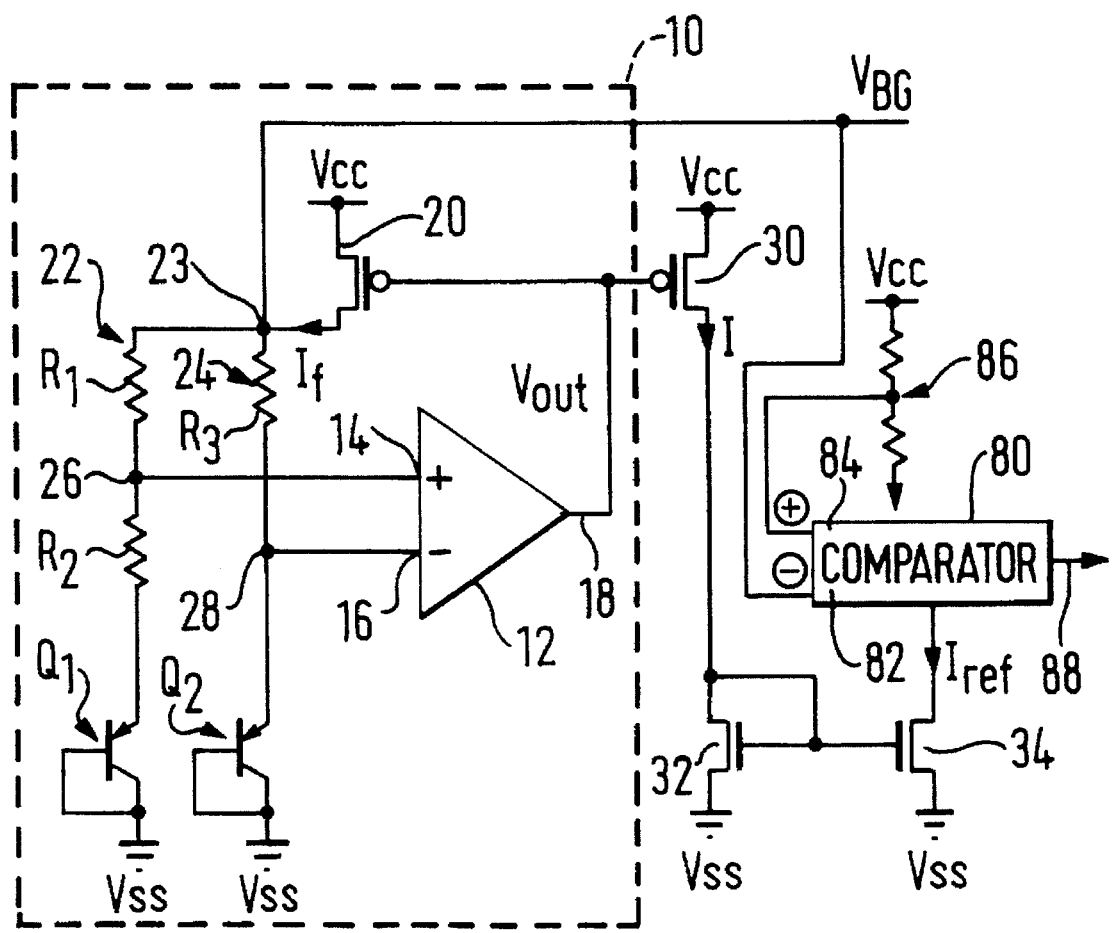
FIG. 2 is a circuit diagram of a current generator in accordance with the present invention.

FIG. 2 illustrates a current generator circuit in accordance with one embodiment of the present invention. The circuit includes a known bandgap reference circuit which is outlined by the dotted line denoted 10. The bandgap reference circuit includes an operational amplifier 12 having a plus input 14 and a minus input 16. The output signal Vout of the operational amplifier 12 on line 18 is supplied to the gate of a p-channel output transistor 20 which has its source connected to an upper power supply voltage rail Vcc and its drain connected to supply a feedback current If to first and second resistive chains 22,24. The first resistive chain 22 includes a first resistor R1 and a second resistor R2 connected in series. The second resistor R2 is also connected to the emitter of a first diode connected p-n-p bipolar transistor Q1. The second resistive chain comprises a single resistor R3 which is connected to the emitter of a second diode-connected p-n-p bipolar transistor Q2. The plus input 14 of the operational amplifier 12 receives its input from a node 26 intermediate the first and second resistors R1,R2 of the first resistive chain 22. The minus input 16 of the operational amplifier 12 receives its input from a node 28 intermediate the resistor R3 of the second resistive chain 24 and the emitter of the second bipolar transistor Q2. The collectors of the bipolar transistors Q1,Q2 are connected to the lower supply rail Vss, which will normally be at ground. The bandgap reference voltage $V_{BG}$ generated by the bandgap circuit 10 is taken from an output node 23 at the junction of the first and second resistive chains. It will readily be appreciated that the operational amplifier 12 requires a power supply voltage which is taken from the power supply rails Vcc and Vss but which is not shown in FIG. 2.

Operation of the bandgap circuit is well known to a person skilled in the art and is therefore only discussed briefly herein. The first bipolar transistor Q1 is designed to have an emitter area which is several times larger than the emitter area of the bipolar transistor Q2. In practice, the bipolar transistor Q1 can be implemented as several placements of the second transistor Q2. The base emitter voltage Vbe across the bipolar transistors Q1,Q2 varies linearly between 0.8 V and 0.4 V when the temperature varies from minus 55° C. to 125° C. As the emitter area of the bipolar transistor Q1 is larger than the emitter area of the bipolar transistor Q2 but has the same current through it, the bipolar transistor Q1 has a lower base emitter voltage across it. The resistors R1, R2 and R3 in the first and second resistive chains, together with the operational amplifier 12 amplify this voltage difference by a suitable voltage and add it to the original base emitter voltage Vbe to produce a constant voltage $V_{BG}$ at the output node 23 of the bandgap circuit 10. This is a very good reference because it does not depend on temperature or the power supply voltage Vcc.

The resistors R1, R2 and R3 are implemented as n-well diffusions. The resistors could alternatively be implemented as p-well diffusions or as p+ or n+ resistive elements. Their resistance increases by a factor of 2 (approximately) over the temperature range from minus 55° C. to 125° C. However, since the reference voltage $V_{BG}$ at node 23 is fixed at about 1.25 V, the voltage across the resistors R1 and R3 varies from 0.45 V to 0.85 V. Thus, when the resistance is largest, so is the voltage. Thus, the current taken by the resistive chains 22,24 is substantially constant. This means that the feedback current If is substantially constant. In particular, it does not depend on the supply voltage Vcc or (to a first approximation) on temperature. The resistors R1,R2 are selected to optimise constant current performance of the circuit by selecting their resistance variation with temperature to match the variation of the bipolar transistor Q1,Q2.

The present invention utilises this feature to provide a substantially constant current Iref. The output signal on line 18 from the operational amplifier 12 is used to drive a p-channel transistor 30. From the above explanation, it will readily be appreciated that the current at the drain of the p-channel transistor 30, which is denoted I in FIG. 2 will be substantially constant for the same reason that the feedback current If is substantially constant. If the circuit were to act as a current source, this current I could be used as a reference current. FIG. 2 shows a current sink. The current I is supplied to a first current mirror transistor 32 which is connected in a known fashion to a second current mirror transistor 34. The second current mirror transistor provides a reference current Iref which is matched to, or a multiple of, the current I set by the p-channel transistor 30. Because the current I is substantially constant, the reference current Iref will be substantially constant despite variations in power supply voltage Vcc and temperature.

FIG. 2 also illustrates one use of the constant reference current Iref as a bias current for a comparator 80. The comparator has a negative input connected to the constant voltage $V_{BG}$ and a positive input connected to receive a signal derived from the power supply voltage Vcc via a resistive chain 86. The comparator 80 comprises a long-tailed pair amplification circuit which uses the reference current Iref as its bias current. The comparator 80 is operative to compare the constant voltage $V_{BG}$ with the signal derived from the power supply voltage to generate an output signal on line 88 when the power supply voltage Vcc exceeds a predetermined value. The bias current Iref could be supplied to a plurality of comparators for sensing different power supply levels.

Although the circuit of FIG. 2 illustrates p-n-p transistors, it will readily be apparent that n-p-n transistors could be used with appropriate changes to the supply and reference voltage connections.

Figure 3:
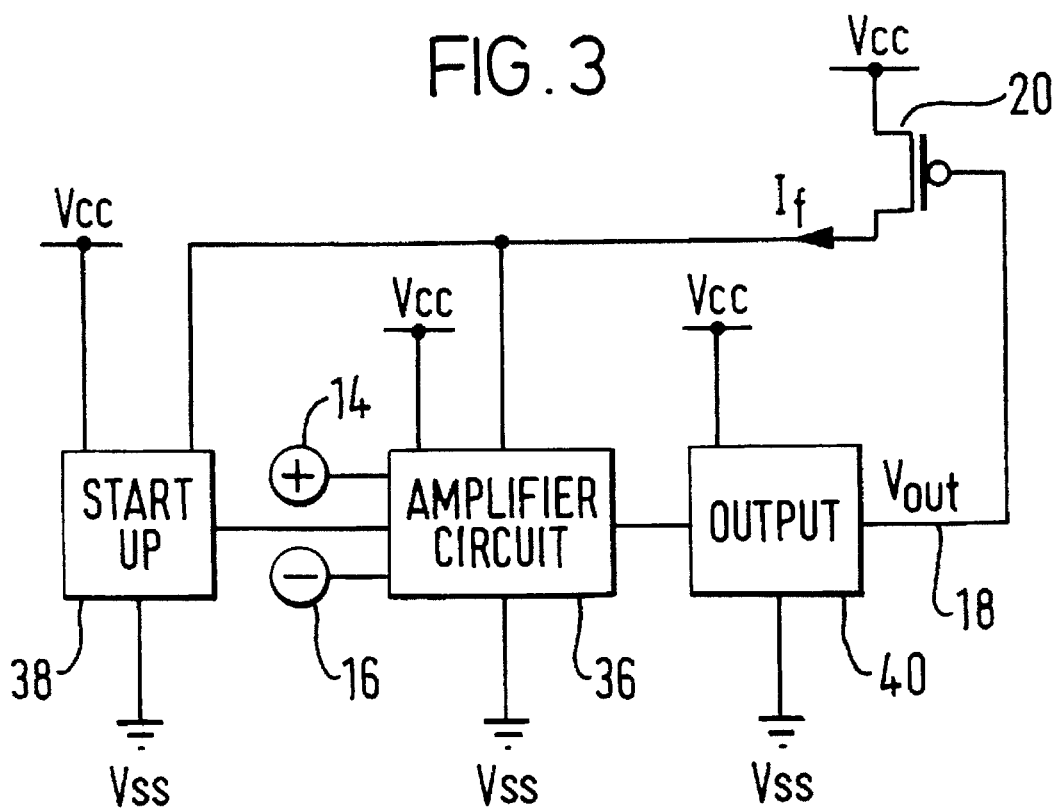
FIG. 3 is a block diagram indicating schematically the circuits within the operational amplifier of the circuit of FIG. 2.

FIG. 3 illustrates the main circuits internal to the operational amplifier 12. These include an amplifier which may for example be a long tailed pair which is connected to the plus and minus inputs 14,16 of the operational amplifier. The operational amplifier 12 also includes a start-up circuit 38 and an output circuit 40. The start-up circuit 38 and amplifier circuit 36 require current references for their operation. These current references are taken from the feedback current If derived from transistor 20, which provides a particularly well controlled current consumption as well as improved immunity against variations in the power supply voltage Vcc. It will readily be apparent that a current having the same characteristics as the feedback current If could be generated within the start-up circuit 38 and amplifier circuit 36 by using a separate transistor like transistor 20 within each circuit, with its gate voltage being Vout.

Figure 4:
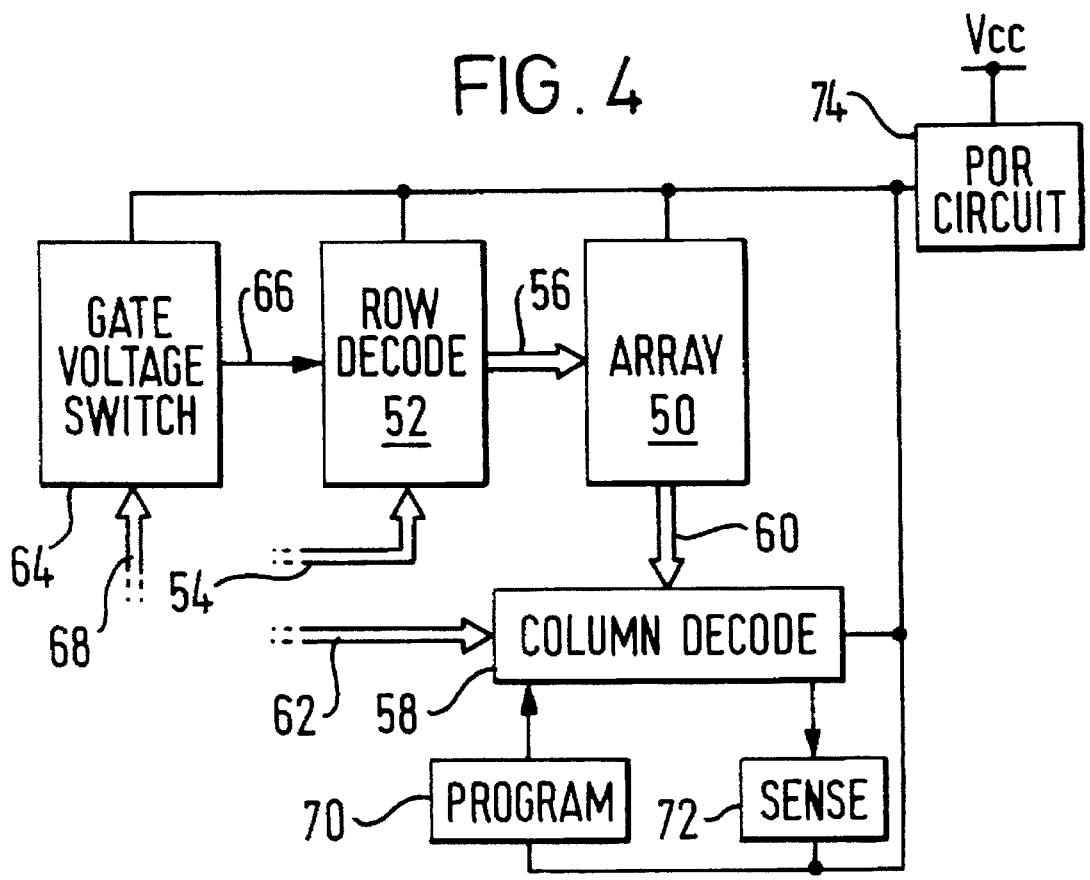
FIG. 4 is a simplified schematic of a flash memory chip.

The invention has particular application in providing a substantially constant reference current which can be used as a bias for a comparator in a power supply detection circuit as explained above. FIG. 4 is a simplified schematic of a flash memory chip utilising a power supply detection circuit. In FIG. 4, reference numeral 50 denotes a memory array comprising a plurality of EPROM cells arranged in rows and columns. Each EPROM cell comprises a single floating gate transistor. Reference numeral 52 denotes row decode circuitry which receives a row address on line 54 and is connected to the array 50 via wordlines 56. Reference numeral 58 denotes column decode circuitry which is connected to the array 50 via bit lines 60. The column decode circuitry 58 receive a column address on line 62. A gate voltage switch 64 supplies a suitable wordline voltage on line 66 to the array 50, switched via the row decode circuit 52. The appropriate voltage is selected under the control of programming signals 68. The column decode circuit 58 selectively connects appropriate ones of the bit lines to programming circuitry 70 for programming the cells in the array or to sense circuitry 72 for reading from the array. The chip includes a power supply detection circuit 74 which is connected to each of the array 50, row decode circuit 52, gate voltage switch 64, column decode circuit 58, sense circuit 72 and program circuit 70 for allowing these circuits to function only when an adequate power supply Vcc has been reached. Although not shown in FIG. 4, it will be appreciated that the power supply Vcc is also supplied to each of the circuits of the flash memory chip.

What is claimed is:

1. A current generator circuit for generating a substantially constant reference current which includes a bandgap reference circuit comprising:

an operational amplifier having first and second inputs receiving signals respectively from intermediate nodes of first and second resistive chains, each resistive chain having in series a first terminal connected to a first potential, a unidirectional current control element, at least one resistive element and a second terminal, the second terminals of the resistive chains being connected at a junction node;

the operational amplifier having an output for supplying an output signal to a control terminal of an output device which has a controllable path connected between a power supply voltage and said junction node of said first and second resistive chains, the current generator circuit further comprising:

a current setting device which receives at a control terminal thereof the output signal of the operational amplifier and which has its controllable path connected between said power supply voltage and a current supply terminal to provide at said current supply terminal a substantially constant reference current.

2. A current generator circuit according to claim 1 wherein the current supply terminal is connected to a first current mirror transistor and wherein the circuit further comprises a second current mirror transistor which is connected to said first current mirror transistor to take a current varying with said substantially constant reference current.

3. A current generator circuit according to claim 1 or 2 wherein each unidirectional current control element is a diode connected bipolar transistor.

4. A current generator circuit according to claim 3 wherein said resistive elements are selected to have a variation in resistance with temperature matched to the variation in base emitter voltage of the transistors in each resistive chain to maintain a feedback current supplied by said output device to said junction node substantially constant.

5. A current generator circuit according to claim 1 wherein the operational amplifier includes amplification circuitry supplied by a reference current derived from the output signal of the operational amplifier.

6. A current generator circuit according to claim 5 wherein the operational amplifier further includes start-up circuitry which also receives as its reference current a current derived from the output signal of said operational amplifier.

7. A current generator circuit according to claim 1 wherein said at least one resistive element in each resistive chain is formed as an n-well diffusion.

8. A current generator circuit according to claims 1 wherein said resistive elements are formed as p-well diffusions.

9. A current generator circuit according to claim 1 wherein the bandgap reference circuit provides a reference voltage at said junction node.

10. A current generator circuit for generating a substantially constant reference current which includes a bandgap reference circuit comprising:

an operational amplifier having first and second inputs receiving signals respectively from intermediate nodes of first and second resistive chains, each resistive chain having in series a first terminal connected to a first potential, a unidirectional current control element, at least one resistive element and a second terminal, the second terminals of the resistive chains being connected at a junction node;

the operational amplifier having an output for supplying an output signal to a control terminal of an output device which has a controllable path connected between a power supply voltage and said junction node of said first and second resistive chains, the current generator circuit further comprising:

a current setting device which receives at a control terminal thereof the output signal of the operational amplifier and which has its controllable path connected between said power supply voltage and a current supply terminal to provide at said current supply terminal a substantially constant reference current;

wherein the resistive elements are selected to have a variation in resistance with temperature matched to the variation in base emitter voltage of the transistors in each resistive chain to maintain a feedback current supplied by said output device to said junction node substantially constant, said resistive elements being formed as n-well diffusions.

11. A current generator circuit for generating a substantially constant reference current which includes a bandgap reference circuit comprising:

an operational amplifier having first and second inputs receiving signals respectively from intermediate nodes of first and second resistive chains, each resistive chain having in series a first terminal connected to a first potential, a unidirectional current control element, at least one resistive element and a second terminal, the second terminals of the resistive chains being connected at a junction node;

the operational amplifier having an output for supplying an output signal to a control terminal of an output device which has a controllable path connected between a power supply voltage and said junction node of said first and second resistive chains, the current generator circuit further comprising:

a current setting device which receives at a control terminal thereof the output signal of the operational amplifier and which has its controllable path connected between said power supply voltage and a current supply terminal to provide at said current supply terminal a substantially constant reference current;

wherein the resistive elements are selected to have a variation in resistance with temperature matched to the variation in base emitter voltage of the transistors in each resistive chain to maintain a feedback current supplied by said output device to said junction node substantially constant, said resistive elements being formed as p-well diffusions.

12. An integrated circuit comprising:

an array of reprogrammable memory cells;

decode circuitry associated with said array; and a current generator circuit for generating a substantially constant reference current which includes a bandgap reference circuit comprising:

an operational amplifier having first and second inputs receiving signals respectively from intermediate nodes of first and second resistive chains, each resistive chain having in series a first terminal connected to a first potential, a unidirectional current control element, at least one resistive element and a second terminal, the second terminals of the resistive chains being connected at a junction node;

the operational amplifier having an output for supplying an output signal to a control terminal of an output device which has a controllable path connected between a power supply voltage and said junction node of said first and second resistive chains, the current generator circuit further comprising:

a current setting device which receives at a control terminal thereof the output signal of the operational amplifier and which has its controllable path connected between said power supply voltage and a current supply terminal to provide at said current supply terminal a substantially constant reference current.

13. An integrated circuit according to claim 12 wherein the current supply terminal of the current generator circuit is connected to a first current mirror transistor and wherein the circuit further comprises a second current mirror transistor which is connected to said first current mirror transistor to take a current varying with said substantially constant reference current.

14. An integrated circuit according to claim 12 or 13 wherein said reprogrammable memory cells are EPROM cells.

15. An integrated circuit according to claims 12 or 13 wherein said resistive elements are selected to have a variation in resistance with temperature matched to the variation in base emitter voltage of the transistors in each resistive chain to maintain a feedback current supplied by said output device and said junction node substantially constant.

* * * * *